United States Patent
Kurita

(10) Patent No.: US 9,549,491 B2
(45) Date of Patent: Jan. 17, 2017

(54) CONDUCTIVE CLIP

(71) Applicant: KITAGAWA INDUSTRIES CO., LTD., Aichi (JP)

(72) Inventor: Tomohisa Kurita, Aichi (JP)

(73) Assignee: KITAGAWA INDUSTRIES CO., LTD., Aichi (JP)

(*) Notice: Subject to any disclaimer, the term of this patent is extended or adjusted under 35 U.S.C. 154(b) by 0 days.

(21) Appl. No.: 14/431,291

(22) PCT Filed: Apr. 7, 2014

(86) PCT No.: PCT/JP2014/060115
§ 371 (c)(1),
(2) Date: Mar. 25, 2015

(87) PCT Pub. No.: WO2014/192425
PCT Pub. Date: Dec. 4, 2014

(65) Prior Publication Data
US 2016/0081236 A1    Mar. 17, 2016

(30) Foreign Application Priority Data

May 29, 2013  (JP) ................................ 2013-113134

(51) Int. Cl.
*H05K 9/00* (2006.01)
*F16B 2/24* (2006.01)
(52) U.S. Cl.
CPC ............ *H05K 9/0035* (2013.01); *F16B 2/245* (2013.01)
(58) Field of Classification Search
CPC .................................................. H05K 9/0035
See application file for complete search history.

(56) References Cited

U.S. PATENT DOCUMENTS 5,354,951 A * 10/1994 Lange, Sr. ........... H05K 9/0032
174/372
5,577,268 A   11/1996 Ho et al.
(Continued)

FOREIGN PATENT DOCUMENTS

JP          3020603 U     2/1996
JP        H11-026978 A    1/1999
(Continued)

OTHER PUBLICATIONS

Translations of the International Preliminary Report on Patentability from appl. No. PCT/JP2014/060115, dated Dec. 10, 2015.
(Continued)

*Primary Examiner* — Hung V Ngo
(74) *Attorney, Agent, or Firm* — Koppel, Patrick, Heybl & Philpott

(57) ABSTRACT

A conductive clip according to an aspect of the present invention includes a base portion and plural grip pieces. The plural grip pieces is configured to be able to grip a plate-like portion that is a part of a shield case. The grip piece includes a first portion, a second portion, a third portion, and a convex portion. In at least one press-contacted with the one surface of the plate-like portion and at least one press-contacted with the other surface of the plate-like portion among the plural grip pieces, the first portions and the second portions are provided to face each other with the position of the plate-like portion interposed therebetween, and the third portions are provided at positions where parts of distal end portions of the third portions in the extension direction do not overlap with each other when viewed from a direction perpendicular to the plate-like portion.

2 Claims, 4 Drawing Sheets

(56) References Cited

U.S. PATENT DOCUMENTS

| | | | | |
|---|---|---|---|---|
| 6,051,781 | A * | 4/2000 | Bianca | H05K 9/0035 174/250 |
| 6,267,629 | B1 | 7/2001 | Nguyen et al. | |
| 7,501,587 | B2 * | 3/2009 | English | H05K 9/0032 174/354 |
| 2007/0035938 | A1 * | 2/2007 | Rochford | H05K 13/046 361/816 |
| 2013/0148318 | A1 * | 6/2013 | Kim | H05K 9/0035 361/759 |
| 2013/0280968 | A1 * | 10/2013 | Kurita | H01R 4/48 439/863 |
| 2016/0099525 | A1 * | 4/2016 | Kurita | H05K 9/0035 439/83 |
| 2016/0150685 | A1 * | 5/2016 | Kurita | H05K 9/0026 174/384 |

FOREIGN PATENT DOCUMENTS

| | | |
|---|---|---|
| JP | 2003-051692 A | 2/2003 |
| JP | 2005-332953 A | 12/2005 |
| JP | 2008-124196 A | 5/2008 |
| KR | 20080006506 A | 1/2008 |
| KR | 20110029067 A | 3/2011 |
| WO | WO2009/025405 A1 | 2/2009 |

OTHER PUBLICATIONS

Form PCT/ISA/210 International Search Report for PCT/JP2014/060115 mailed May 13, 2014.
Notice of Final Rejection issued Oct. 10, 2016 in the corresponding Korean Patent Application No. 10-2015-7004167 (English translation also attached).

* cited by examiner

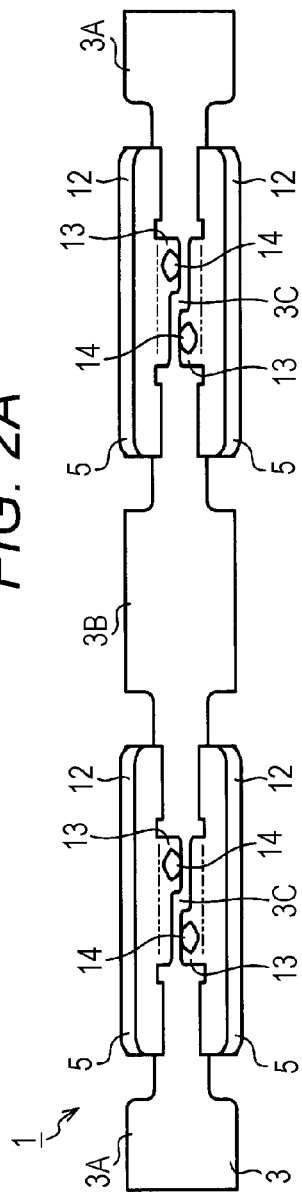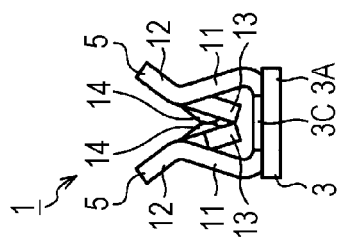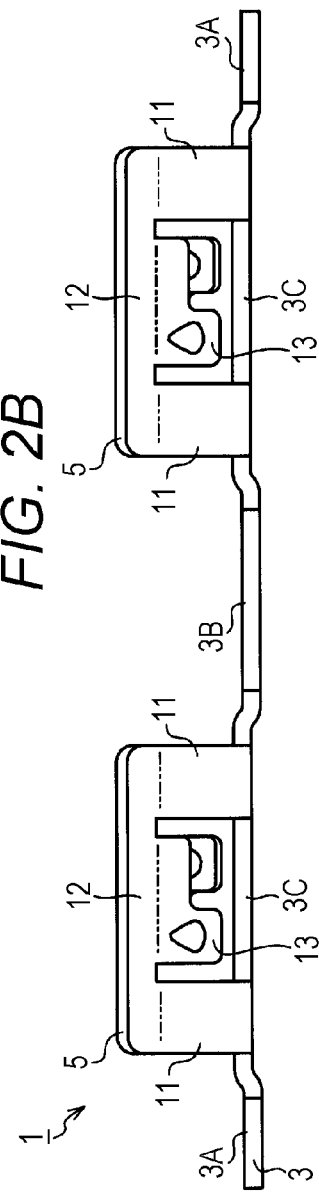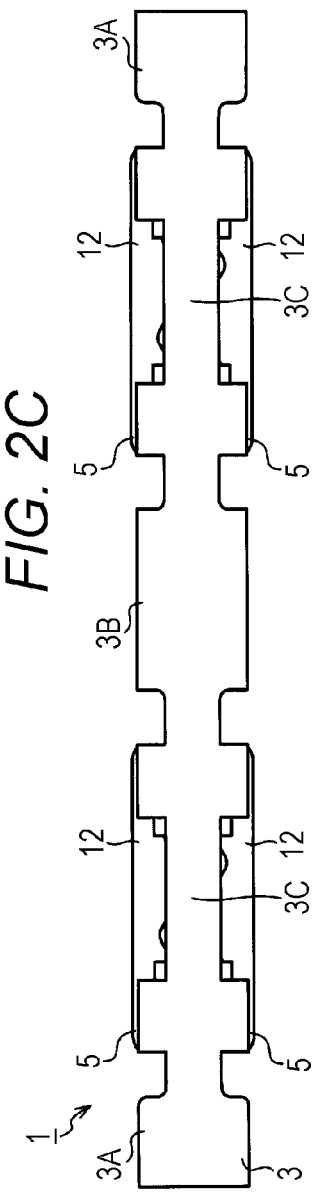

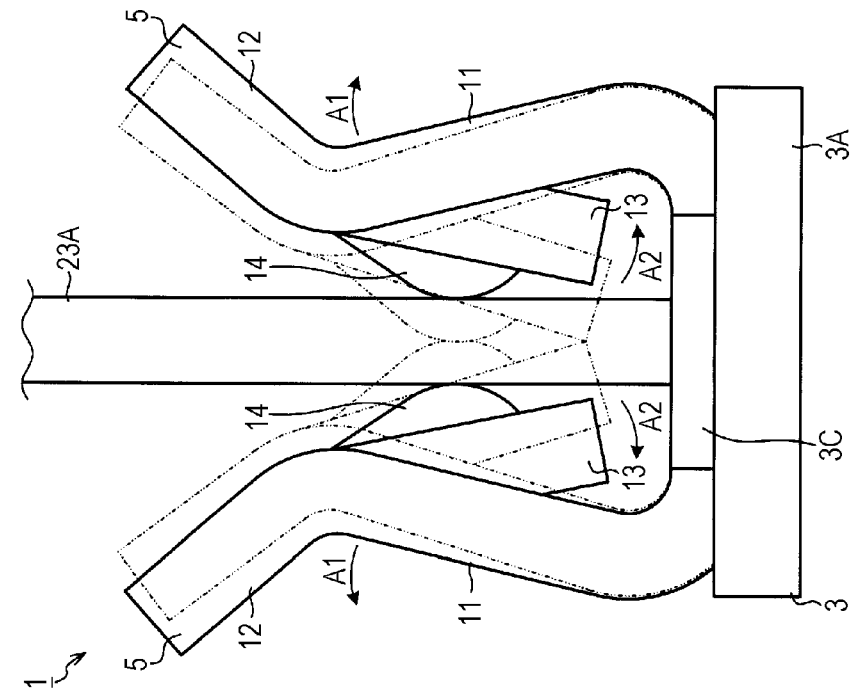
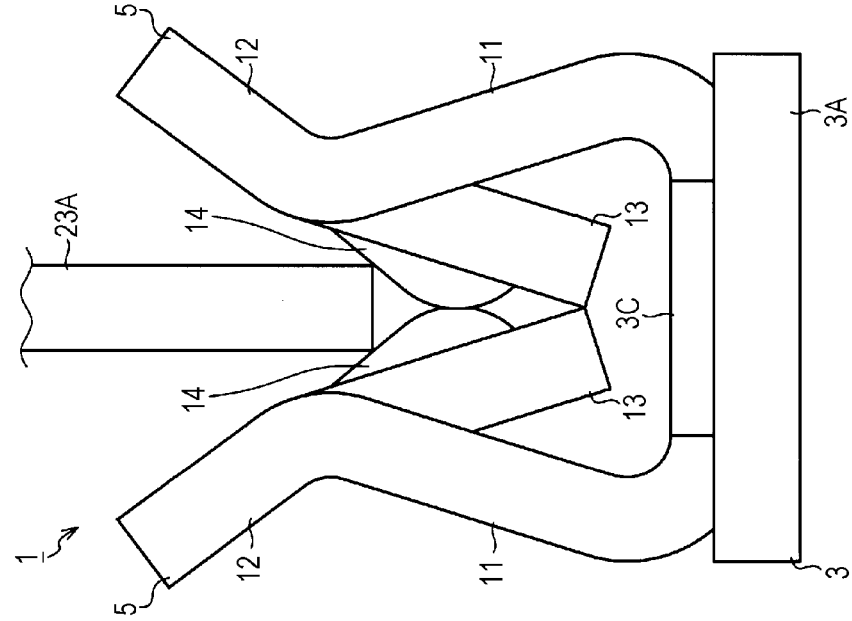

CONDUCTIVE CLIP

CROSS-REFERENCE TO RELATED APPLICATION

This application claims priority from Japanese Patent Application No. 2013-113134 filed with the Japan Patent Office on May 29, 2013, the entire content of which is hereby incorporated by reference.

TECHNICAL FIELD

The present invention relates to a conductive clip configured to grip a shield case and electrically connect the shield case to a conductor portion of a printed wiring board when the shield case is soldered to a conductor portion of the printed wiring board to be disposed at a position where it can cover an electronic component on the printed wiring board.

BACKGROUND ART

Among conductive clips, for example, there is a proposed conductive clip as described in Patent Literature 1 below. The conductive clip illustrated in FIG. 1 to FIG. 4 of Patent Literature 1 has a plurality of pairs of press-contact pieces. In each pair, the press-contact pieces face each other at positions across a part of the shield case to be gripped. Each press-contact piece has one end as a fixed end integrally formed on a part of the conductive clip and the other end as a free end displaced with elastic deformation of the press-contact piece. For both the press-contact pieces in the pair, their fixed ends are positioned farther apart from a printed wiring board than their free ends. Portions respectively ranging from the fixed ends to the free ends extend in a direction where the respective portions closer to the free ends approach closer to each other and also approach closer to the printed circuit board.

FIG. 5 and FIG. 6 of Patent Literature 1 also illustrate a conductive clip with another shape. This conductive clip is also provided with a plurality of pairs of press-contact pieces. In each pair, the press-contact pieces face each other at positions across a part of the shield case to be gripped. For both the press-contact pieces of this conductive clip, the free-end is positioned farther apart from a printed wiring board than the fixed-end.

CITATION LIST

Patent Literature

PATENT LITERATURE 1: JP-A-H-11-26978

SUMMARY OF INVENTION

Problems to be Solved by the Invention

However, each of the conductive clips described in the above Patent Literature 1 still has room for improvement in the following points. First, in each of two different conductive clips disclosed in Patent Literature 1, the paired press-contact pieces are disposed at positions where they can face each other across a part of the shield case to be gripped. Therefore, when forming the paired press-contact pieces by press working or the like, the press-contact pieces can be separated from each other due to the spring back even if the paired press-contact pieces are bent until the pieces are brought into contact with each other. Thus, a space is formed between the press-contact pieces. In the conductive clip structured as described above, therefore, it is difficult to bring the initial positions of the paired press-contact pieces closer to each other. As a result, a further improvement in press-contact force of the press-contact piece against the shield case can be difficult.

Moreover, in the case of the two different conductive clips disclosed in Patent Literature 1, when the force that displaces the shield case acts on the shield case, the press-contact force of the press-contact pieces against the shield case tends to decrease depending on the direction of the force.

For example, in the case of the conductive clip illustrated in FIG. 1 to FIG. 4 of Patent Literature 1, both the press-contact pieces in the pair extend in a direction where the closer the parts of the press-contact pieces are to the free ends, the closer they approach to the printed wiring board; and the closer the parts of the press-contact pieces are to the free ends, the more the distance between the press-contact pieces decreases. Therefore, when the shield case is gripped between such press-contact pieces, the displacement of the shield case in a direction where the shield case approaches the printed wiring board causes a component of the friction force acting between the press-contact piece and the shield case to act in a direction where the space between the free ends of the paired press-contact pieces is expanded. As a result, when the space between the free ends of the paired press-contact pieces is expanded, a reduction in press-contact force of the press-contact pieces against the shield case occurs, resulting in a state where the shield case can be easily displaced.

On the other hand, in the case of the conductive clip illustrated in FIG. 5 and FIG. 6 of Patent Literature 1, for both the press-contact pieces in the pair, the parts of press-contact pieces closer to the free ends is more separated from the printed wiring board. A portion ranging from the fixed end to a bent portion at the middle between the fixed end and the free end extends in a direction where the closer the portion is to the bent portion the more the distance between the press-contact pieces decreases. Therefore, in the case where the shield case is gripped between the press-contact pieces (between the bent portions), the displacement of the shield case in a direction where the shield case is separated from the printed wiring board causes a component of the friction force acting between the press-contact piece and the shield case to act in the direction where the space between the bent portions of the paired press-contact pieces is expanded. Thus, when the space between the bent portions of the paired press-contact pieces is expanded, a reduction in press-contact force of the press-contact pieces against the shield case occurs, resulting in a state where the shield case is easily displaced.

In other words, in the two different conductive clips disclosed in Patent Literature 1, the press-contact force of the paired press-contact pieces can be easily reduced when the shield case is nearly displaced in a direction where the shield case is pushed in toward the printed wiring board or in a direction where the shield case is separated from the printed wiring board.

In an aspect of the present invention, therefore, a conductive clip with higher capability of gripping the shield case is desirably provided.

Solutions to the Problems

Hereinafter, a structure employed in the present invention is described.

A conductive clip according to an aspect of the present invention includes a base portion and a plurality of grip pieces. The base portion has a joint surface to be soldered to a conductor portion of a printed wiring board. Each of the plurality of grip pieces extends from the base portion and is configured to be elastically deformable. The plurality of grip pieces, in a case that a plate-like portion that is a part of a shield case is disposed perpendicular to the printed wiring board when the shield case is disposed at a position where the shield case covers an electronic component mounted on the printed wiring board, is configured to bring the plate-like portion into a state of being gripped by bringing at least one grip piece into press-contacted with one surface of opposite surfaces of the plate-like portion and bringing at least one grip piece into press-contacted with the other surface. The grip piece includes a first portion, a second portion, a third portion, and a convex portion. The first portion is shaped to extend in a direction apart from the base portion ranging from a base end integrally formed on the base portion to a distal end of the first portion and the direction where the first portion extends is a direction where the part closer to the distal end of the first portion is closer to the plate-like portion when the plate-like portion is disposed perpendicular to the printed wiring board. The second portion is shaped to extend in a direction apart from the base portion ranging from a base end integrally formed on the first portion to a distal end of the second portion and the direction where the second portion extends is a direction where the part closer to the distal end of the second portion is more separated from the plate-like portion when the plate-like portion is disposed perpendicular to the printed wiring board. The third portion is shaped to extend in a direction approaching the base portion ranging from a base end integrally formed on the second portion to the distal end of the third portion and the direction where the third portion extends is a direction where the part closer to the distal end of the third portion is closer to the plate-like portion when the plate-like portion is disposed perpendicular to the printed wiring board. The convex portion is disposed to protrude from the third portion and is configured to be brought into press-contacted with the plate-like portion when the plate-like portion is disposed perpendicular to the printed wiring board. In at least one grip piece press-contacted with the one surface and at least one grip piece press-contacted with the other surface among the plural grip pieces, the first portions are provided so as to face each other with the disposing position of the plate-like portion located therebetween and the second portions are provided so as to face each other with the disposing position of the plate-like portion located therebetween, and the third portions are provided at positions where parts of distal end portions of the third portions in the extension direction do not overlap with each other when viewed from a direction perpendicular to the plate-like portion.

According to the conductive clip configured as above, in at least one grip piece in press-contact with the one surface and at least one grip piece in press-contact with the other surface among the plural grip pieces, the first portions are provided so as to face each other with the disposing position of the plate-like portion located therebetween and the second portions are provided so as to face each other with the disposing position of the plate-like portion located therebetween. Note that the third portions of these two grip pieces be provided so that parts of distal end portions thereof in the extension direction do not overlap with each other when viewed from a direction perpendicular to the plate-like portion.

Thus, even when the third portions of the conductive clip structured as described above are formed by press working, for example, each third portion can be largely displaced in a direction. The direction is perpendicular to the plate-like portion without any interaction between the parts of distal end portions of the third portions in the extension direction. Therefore, in the processing, the third portions can be largely displaced somewhat excessively in a direction perpendicular to the plate-like portion in consideration of the amount of spring back after the processing. Thus, the initial positions of the third portions can be set closer to the plate-like portion. Therefore, as compared to the case in which the parts of distal end portions of third portions in the extension direction overlap with each other when viewed from the direction perpendicular to the plate-like portion, the press-contact force of the convex portions of the third portions relative to the plate-like portion can be increased. Thus, the capability of gripping the shield case can be improved.

The parts of distal end portions of the third portions in the extension direction do not overlap with each other when viewed from the direction perpendicular to the plate-like portion. However, the first portions are provided so as to face each other with the disposing position of the plate-like portion located therebetween and the second portions are provided so as to face each other with the disposing position of the plate-like portion located therebetween. As a result, the two grip pieces are disposed close to each other at the place where the first portions face each other and the second portions face each other. Accordingly, the space between the two grip pieces is equal to or smaller than the space in the case where the two grip pieces are provided not to overlap with each other when viewed in the direction perpendicular to the plate-like portion. Thus, placing the plate-like portion between the closely provided two grip pieces makes it possible to have each grip piece and the plate-like portion disposed sufficiently close to each other. Therefore, the convex portion can be brought into press-contact with the plate-like portion as appropriate.

Moreover, in this conducive clip, the first portions on both sides of the plate-like portion is inclined in such a manner that as the first portion is separated from the printed wiring board, the space between the first portions is more reduced. Therefore, when the shield case is displaced in a direction of pushing the shield case held between the convex portions further into the space between the convex portions, a component of the friction force operating between the convex portion and the shield case acts in the direction of attracting the first portion on both sides of the plate-like portion toward the plate-like portion.

Meanwhile, in this conductive clip, the third portion on both sides of the plate-like portion is inclined in such a manner that as the third portion approaches the printed wiring board, the space between the third portions is more reduced. Therefore, when the shield case is displaced in a direction of pulling out the shield case held between the convex portions from between the convex portions, a component of the friction force operating between the convex portion and the shield case acts in the direction of attracting the third portion on both sides of the plate-like portion toward the plate-like portion.

Thus, the press-contact force of the grip piece tends to increase either in the case where the shield case is pushed into the space between the convex portions or in the case where the shield case is pulled out from the space between the convex portions. This can effectively suppress the displacement of the shield case.

By the way, it is preferable for the above-mentioned conductive clip to be configured as follows. That is to say, in one grip piece, a pair of the first portions may be provided with a space therebetween, the second portion may be bridged between the distal ends of the pair of the first portions, and the third portion may be integrally formed on an area of the base end of the second portion, the area being integrally formed on the distal end of each of the pair of the first portions.

According to the conductive clip configured as above, in at least one grip piece in press-contact with the one surface and at least one grip piece in press-contact with the other surface among the plural grip pieces, the first portions facing each other and the second portions facing each other are provided. Note that the third portions can be disposed so as not to overlap with each other when viewed from the direction perpendicular to the plate-like portion. Thus, the desired operation and effect can be achieved in regard to each of the first portions, the second portions, and the third portions.

In addition, in the above-mentioned conductive clip, in at least one grip piece press-contacted with the one surface and at least one grip piece press-contacted with the other surface among the plural grip pieces, each convex portion may be provided at a position where space is not formed between the convex portions when viewed from a direction parallel to both the plate-like portion and the printed wiring board.

According to the conductive clip configured as above, even when the plate-like portion is extremely thin, both the convex portions on both sides of the plate-like portion are in press-contact with the plate-like portion. Therefore, the press-contact force of each convex portion relative to the plate-like portion can be improved as compared to the case where the region to be the space is formed between the convex portions when viewed from the direction parallel to both the plate-like portion and the printed wiring board.

BRIEF DESCRIPTION OF THE DRAWINGS

FIGS. 2A to 2D are diagrams illustrating the conductive clip of the embodiment, where FIG. 2A is a plan view, FIG. 2B is a front view, FIG. 2C is a bottom view, and FIG. 2D is a right-side view of the conductive clip.

FIGS. 4A and 4B are explanatory diagrams illustrating a state in which the conductive clip of the embodiment is elastically deformed.

DESCRIPTION OF REFERENCE SIGNS

1: Conductive clip; 3: Base portion; 3A, 3B: Soldering portion; 3C: Floating portion; 5: Grip piece; 11: First portion; 12: Second portion; 13: Third portion; 14: Convex portion; 21: Printed wiring board; 23: Shield case; 23A: Plate-like portion; 25: Electronic Component

DESCRIPTION OF EMBODIMENTS

An embodiment of the present invention is described next. In the description below, the up-down direction, the right-left direction, and the front-back direction are indicated with reference to the drawings as necessary. These directions are, however, merely determined to simply describe the relative positional relationship among the portions constituting the conductive clip. The direction of the conductive clip during the actual use may be determined arbitrarily.

[Structure Example of Conductive Clip]

Figure 1:
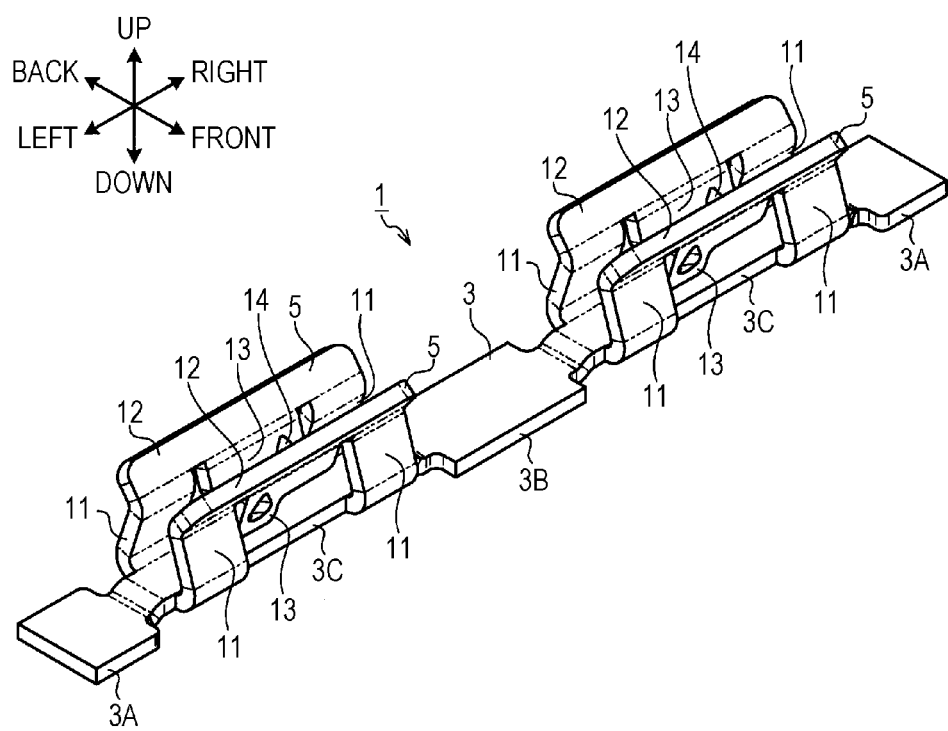
FIG. 1 is a perspective view of a conductive clip of an embodiment.

FIG. 1 is a perspective view of a conductive clip corresponding to an embodiment of the present invention. FIG. 2A is a plan view, FIG. 2B is a front view, FIG. 2C is a bottom view, and FIG. 2D is a right-side view, each illustrating the same conductive clip. The rear view of the conductive clip is the same as the front view thereof. Further, the left-side view of the conductive clip is the same as the right-side view thereof.

A conductive clip 1 described below is formed by press working (punching or bending, for example) a metal thin plate (phosphor bronze for spring with a thickness of 0.1 mm in this embodiment). In this embodiment, a surface of the conductive clip 1 is plated with Cu and Sn.

The conductive clip 1 includes a base portion 3 and grip pieces 5, 5, 5, and 5. As it is evident from FIG. 2A and FIG. 2C, the base portion 3 and the grip pieces 5, 5, 5, and 5 have rotation-symmetric shapes, respectively, such that the shapes remain as they are even after a half turn (180-degree turn) about a vertical axial line as a symmetric axis. In this embodiment, the conductive clip 1 indicated in FIG. 1 has a length of 6.5 mm in the right-left direction, a length of 0.8 mm in the up-down direction, and a length of 0.6 mm in the front-back direction.

The base portion 3 is soldered to the printed wiring board and thus provided as a portion electrically connected to a conductor portion of the printed wiring board. The base portion 3 includes soldering portions 3A, 3A, and 3B, and floating portions 3C and 3C. The lower surfaces of the soldering portions 3A, 3A, and 3B correspond to joint surfaces with the printed wiring board. The upper surface of the soldering portion 3B corresponds to a suction surface that can be sucked by a suction nozzle (not shown) of an automatic packaging machine. Under the conditions that the soldering portions 3A, 3A, and 3B are being soldered to the printed wiring board, the floating portions 3C and 3C are portions in a state of forming a space from the printed wiring board. In this embodiment, the lower surfaces of the floating portions 3C and 3C are 0.05 mm above the lower surfaces of the soldering portions 3A, 3A, and 3B.

The grip piece 5 includes a pair of first portions 11 and 11 extending from the base portion 3, a second portion 12 bridged between upper ends of the first portions 11 and 11, a third portion 13 extending from a position of a lower end of the second portion 12 that is an integrally formed area between the first portions 11 and 11, and a convex portion 14 provided for the third portion 13.

Of the four grip pieces 5, 5, 5, and 5, two located to face each other constitutes a pair. Thus, in this embodiment, two pairs of grip pieces 5 and 5 are formed. The first portions 11 and 11 and the second portions 12 and 12 of the pair of grip pieces 5 and 5 are located in a manner that the first portions 11 and 11 face each other and the second portions 12 and 12 face each other, with the disposing position of the plate-like portion of the shield case, which is to be held between the grip pieces 5 and 5, located between the first portions 11 and 11 as well as between the second portions 12 and 12. On the other hand, the third portions 13 and 13 of the pair of grip pieces 5 and 5 are provided at a position where the parts of distal end portions of the third portions 13 in the extension direction do not overlap with each other when viewed from a direction perpendicular to the plate-like portion of the shield case held between the grip pieces 5 and 5 (see FIG. 2B).

The pair of first portions 11 and 11 of one grip piece 5 is provided at positions on both sides of the space provided in the right-left direction in FIG. 1. Moreover, the pair of first portions 11 and 11 is integrally formed on the base portion 3 at the place to be the lower end when the joint surfaces of the soldering portions 3A, 3A and 3B are directed downward. The first portions 11 and 11 extend obliquely upward from the integrally formed area. The extension direction of the first portion 11 is the direction where the parts closer to the upper ends of the first portion 11 are closer to the plate-like portion of the shield case held between the grip pieces 5 and 5 when the plate-like portion is disposed perpendicular to the printed wiring board. Therefore, the first portions 11 and 11 of the grip pieces 5 and 5 disposed to face each other with the plate-like portion interposed therebetween are inclined so that the parts closer to the upper ends of the first portions 11 are closer to each other as illustrated in FIG. 2D.

The second portion 12 of one grip piece 5 is bridged between the upper ends of the pair of first portions 11 and 11 in the state that the joint surfaces of the soldering portions 3A, 3A, and 3B are directed downward. The lower end of the second portion 12 is integrally formed on the upper ends of the first portions 11 and 11. The second portion 12 extends obliquely upward from the integrally formed area. The extension direction of the second portion 12 is the direction where the part closer to the upper end of the second portion 12 is more separated farther from the plate-like portion of the shield case held between the grip pieces 5 and 5 when the plate-like portion is disposed perpendicular to the printed wiring board. Therefore, the second portions 12 and 12 of the grip pieces 5 and 5 disposed to face each other with the plate-like portion interposed therebetween are inclined in a direction where the parts closer to the upper ends of the second portions 12 are more separated from each other as illustrated in FIG. 2D.

As for the third portion 13, the upper end of the third portion 13 is integrally formed at the position in the area where each of the pair of first portions 11 and 11 is integrally formed on the lower end of the second portion 12 in the state that the joint surfaces of the soldering portions 3A, 3A, and 3B are directed downward. The third portion 13 extends obliquely downward from the integrally formed area. The extension direction of the third portion 13 is the direction where the part closer to the lower end of the third portion 13 is closer to the plate-like portion of the shield case held between the grip pieces 5 and 5 when the plate-like portion is disposed perpendicular to the printed wiring board. Therefore, the third portions 13 and 13 of the grip pieces 5 and 5 disposed to face each other with the plate-like portion interposed therebetween are inclined in a direction where the parts closer to the lower ends of the third portions 13 and 13 is closer to each other as illustrated in FIG. 2D.

The convex portion 14 is disposed to protrude from the third portion 13. The convex portion 14 is brought into press-contact with the plate-like portion of the shield case held between the grip pieces 5 and 5 when the plate-like portion is disposed perpendicular to the printed wiring board. The convex portions 14 and 14 of the pair of grip pieces 5 and 5 disposed to face each other with the plate-like portion interposed therebetween are provided at the positions not to allow the space therebetween when viewed from a direction parallel to both the plate-like portion and the printed wiring board (see FIG. 2D). In other words, the distance between the convex portions 14 and 14 is zero when viewed from the direction illustrated in FIG. 2D.

[Usage Example of Conductive Clip]

Figure 3:
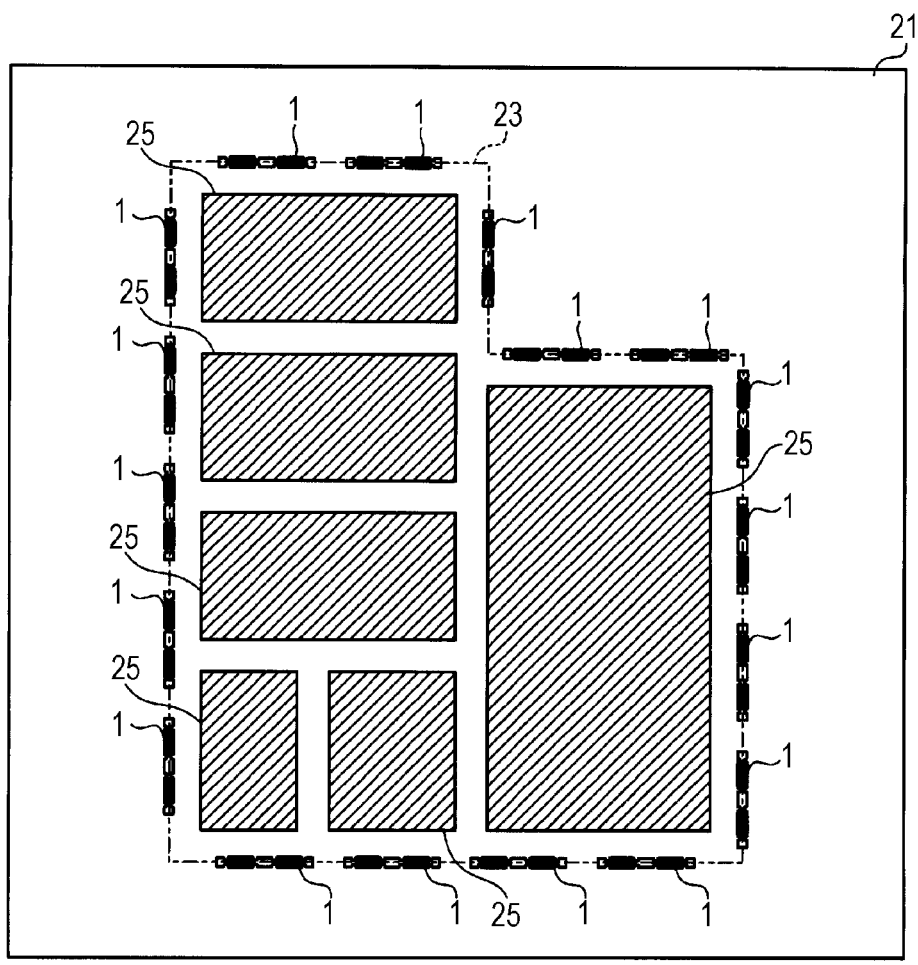
FIG. 3 is an explanatory diagram illustrating the usage of the conductive clip of the embodiment.

The conductive clip 1 configured as above is surface-mounted on a printed wiring board 21 as illustrated in FIG. 3. In this manner, the conductive clip 1 is used to attach a shield case 23 to the printed wiring board 21. The shield case 23 is a metal case attached to surround electronic components 25. The shield case 23 blocks the electromagnetic wave radiated from the electronic components 25 mounted on the printed wiring board 21 to the outside of the device and blocks the electromagnetic wave that enters the electronic components 25 from outside the device.

FIG. 3 illustrates the position of the shield case 23 in plan view. The shield case 23 has a hexagonal ceiling and a side wall vertically extended from a part of or all the sides of this ceiling. These ceiling and side walls are formed by press working a metal thin plate (stainless steel plate with a thickness of 0.1 mm in this embodiment).

The conductive clip 1 is surface-mounted together with the electronic components 25 at the position determined according to the shape and size of the shield case 23. On this occasion, the conductive clip 1 is disposed on the printed wiring board 21 by the automatic packaging machine (not shown). After the surface mount of the conductive clip 1, the shield case 23 is mounted. When the shield case 23 is mounted, the lower end of the shield case 23 is pressed against the conductive clip 1.

Thus, a plate-like portion 23A constituting the side wall of the shield case 23 moves from the position illustrated in FIG. 4A to the position illustrated in FIG. 4B. Then, the plate-like portion 23A is inserted between the grip pieces 5 and 5. Here, the grip pieces 5 and 5 are displaced from the position indicated by the two-dot chain line in FIG. 4B (position indicated by the solid line in FIG. 4A) to the position indicated by the solid line in FIG. 4B along with the elastic deformation.

More specifically, the first portions 11 and 11 of the grip pieces 5 and 5 are elastically deformed in a direction where the space between the upper ends is expanded (in the directions indicated by arrows A1 and A1 in FIG. 4B). On the other hand, the third portions 13 and 13 are elastically deformed in a direction where the space between the lower ends is expanded (in the directions indicated by arrows A2 and A2 in FIG. 4B). The positions of the second portions 12 and 12 are displaced as the second portions 12 and 12 follow the deformation of the first portions 11 and 11 and the third portions 13 and 13. The elastic force of each portion that has been elastically deformed concentrates on the convex portions 14 and 14. As a result, the convex portions 14 and 14 are pressed against the plate-like portion 23A. Thus, the plate-like portion 23A is firmly held between the convex portions 14 and 14. As a result, the shield case 23 is gripped.

In the state that the shield case is gripped (the state illustrated by the solid line in FIG. 4B), the lower end of the plate-like portion 23A is in contact with the base portion 3. Therefore, even if the force that displaces the plate-like portion 23A downward operates, the plate-like portion 23A is not easily displaced downward. In addition, the first portions 11 and 11 suppress the downward displacement of the plate-like portion 23A. In other words, the parts closer to the upper end of the first portions 11 and 11 are inclined to have a narrower space therebetween. Thus, if the force that displaces the plate-like portion 23A downward operates and the friction force operates between the plate-like portion 23A and the convex portions 14 and 14, the component force acts in the direction where the space between the upper ends of the first portions 11 and 11 is reduced. This increases the press-contact force of the convex portions 14 and 14 relative to the plate-like portion 23A. Thus, the operation that suppresses the downward displacement of the plate-like portion 23A is increased.

In the state that the shield case is gripped (the state illustrated by the solid line in FIG. 4B), the third portions 13 and 13 suppress the upward displacement of the plate-like portion 23A. In other words, the parts closer to the lower ends of the third portions 13 and 13 are inclined to have the narrower space therebetween. Therefore, if the force that displaces the plate-like portion 23A upward operates and the friction force operates between the plate-like portion 23A and the convex portions 14 and 14, the component force acts in the direction where the space between the lower ends of the third portions 13 and 13 is reduced. This increases the press-contact force of the convex portions 14 and 14 relative to the plate-like portion 23A. Thus, the operation that suppresses the upward displacement of the plate-like portion 23A is increased.

Note that the conductive clip 1 is soldered to the conductor portion with ground potential on the printed wiring board 21. Thus, the shield case 23 is electrically connected to the conductor portion, so that the shield case 23 also serves as the portion with the ground potential.

Effect

Even when the third portions 13 and 13 of the conductive clip 1 structured as described above are formed by press working, the third portions 13 and 13 can be largely displaced in a direction perpendicular to the plate-like portion 23A without having the parts of distal end portions of the third portions 13 and 13 in the extension direction interfering with each other. Therefore, in the processing, each of the third portions 13 and 13 can be largely displaced somewhat excessively in a direction perpendicular to the plate-like portion 23A in consideration of the amount of spring back after the processing. Thus, the initial position of each of the third portions 13 and 13 can be set to the position closer to the plate-like portion 23A. Therefore, as compared to the case in which the parts of distal end portions of the third portions 13 and 13 in the extension direction overlap with each other when viewed from the direction perpendicular to the plate-like portion 23A, the press-contact force of the convex portions 14 and 14 of the third portions 13 and 13 relative to the plate-like portion 23A can be increased. Thus, the capability of gripping the shield case 23 can be improved.

Moreover, the parts of distal end portions of the third portions 13 and 13 in the extension direction are provided not to overlap with each other when viewed from the direction perpendicular to the plate-like portion 23A. The first portions 11 and 11 are provided so as to face each other with the disposing position of the plate-like portion 23A located therebetween and the second portions 12 and 12 are provided so as to face each other with the disposing position of the plate-like portion 23A located therebetween. Therefore, at the place where the first portions 11 and 11 are provided so as to face each other and the second portions 12 and 12 are provided so as to face each other, the two grip pieces 5 and 5 are placed at the close positions. Accordingly, the two grip pieces 5 and 5 are not greatly apart from each other as compared to the case in which the two grip pieces 5 and 5 are provided not overlapping with each other when viewed from the direction perpendicular to the plate-like portion 23A. As a result, when the plate-like portion 23A is disposed between the closely provided grip pieces 5 and 5, the parallelism between the conductive clip 1 and the plate-like portion 23A is easily maintained. In this case, the deviation between the conductive clip 1 and the plate-like portion 23A with the twisted positional relationship does not occur. Thus, the state in which each of the grip pieces 5 and 5 and the plate-like portion 23A are sufficiently close to each other is easily maintained. As a result, the convex portions 14 and 14 can be brought into press-contact with the plate-like portion 23A as appropriate.

Moreover, as already described in detail, the press-contact force of the grip piece of this conductive clip 1 is easily increased either in the case where the plate-like portion 23A of the shield case 23 is pushed into the space between the convex portions 14 and 14 or in the case where the plate-like portion 23A of the shield case 23 is pulled out from the space between the convex portions 14 and 14. This can effectively suppress the displacement of the shield case 23.

Another Embodiment

One example of the present invention has been described. The present invention is, however, not limited to the above embodiment. The present invention can be implemented in various modes.

For example, in the above embodiment, each of the six sides of the shield case 23 whose shape seems to be hexagonal in plan view is held by one or more conductive clips in the example illustrated in FIG. 3. However, whether all the six sides are held by the conductive clips 1 may be determined arbitrarily. For example, one or more sides of the shield case 23, such as a relatively short side, may be held by the conductive clip 1 disposed for the other side. Alternatively, a particular side may be bonded or attached to the printed wiring board 21 through another means instead of being held by the conductive clip 1. For example, a part of the shield case 23 may be soldered to the printed wiring board 21. Further alternatively, a part of the shield case 23 may be fixed to the printed wiring board 21 with a screw. These fixing methods can be employed in combination with the conductive clip 1.

The number of conductive clips 1 to be disposed for the respective sides may be determined arbitrarily. For example, more conductive clips 1 than illustrated in FIG. 3 may be provided. Alternatively, less conductive clips 1 than illustrated in FIG. 3 may be provided. In the example illustrated in FIG. 3, the plural conductive clips 1 have the same shape. However, the conductive clip with different size and shape may be used in combination.

In the above embodiment, one conductive clip 1 has four grip pieces 5, 5, 5, and 5 and each two of the four grip pieces 5, 5, 5, and 5 constitutes a pair. However, the number of grip pieces and the number of pairs may be determined arbitrarily. For example, the conductive clip may have one pair of grip pieces 5 and 5, or may have six or more grip pieces 5, 5, . . . and 5 constituting three or more pairs. As long as at least one or more pairs of grip pieces satisfy the configuration of the present invention, a grip piece with a configuration different from that of the present invention may be provided additionally.

The invention claimed is:
1. A conductive clip comprising:
a base portion; and
a plurality of grip pieces, wherein:
the base portion has a joint surface to be soldered to a conductor portion of a printed wiring board;

each of the plurality of grip pieces extends from the base portion and is configured to be elastically deformable;

the plurality of grip pieces, in a case for a plate-like portion that is a part of a shield case is disposed substantially perpendicular to the printed wiring board when the shield case is disposed at a position where the shield case covers an electronic component mounted on the printed wiring board, is configured to bring the plate-like portion into a state of being gripped by bringing at least one grip piece into press-contact with one surface of opposite surfaces of the plate-like portion and bringing at least one grip piece into press-contact with the other surface;

each of the plurality of grip pieces comprising a first portion, a second portion, a third portion, and a convex portion;

the first portion is shaped to extend in a direction apart from the base portion ranging from a base end integrally formed on the base portion to a distal end of the first portion and the direction where the first portion extends is a direction where the part closer to the distal end of the first portion is closer to the plate-like portion when the plate-like portion is disposed perpendicular to the printed wiring board;

the second portion is shaped to extend in a direction apart from the base portion ranging from a base end integrally formed on the first portion to a distal end of the second portion and the direction where the second portion extends is a direction where the part closer to the distal end of the second portion is more separated from the plate-like portion when the plate-like portion is disposed perpendicular to the printed wiring board;

the third portion is shaped to extend in a direction approaching the base portion ranging from a base end integrally formed on the second portion to the distal end of the third portion and the direction where the third portion extends is a direction where the part closer to the distal end of the third portion is closer to the plate-like portion when the plate-like portion is disposed perpendicular to the printed wiring board;

the convex portion is disposed to protrude from the third portion and is configured to be brought into press-contacted with the plate-like portion when the plate-like portion is disposed perpendicular to the printed wiring board; and at least one grip piece press-contacted with the one surface and at least one grip piece press-contacted with the other surface among the plurality of grip pieces, the first portions are provided so as to face each other with the disposing position of the plate-like portion located therebetween and the second portions are provided so as to face each other with the disposing position of the plate-like portion located therebetween, and the third portions are provided at positions where parts of distal end portions of the third portions in the extension direction do not overlap with each other when viewed from a direction perpendicular to the plate-like portion;

wherein each convex portion of the at least one grip piece press-contacted with the one surface and each convex portion of the at least one grip piece press-contacted with the other surface are provided at a position where space is not formed between the convex portions when viewed from a direction parallel to both the plate-like portion and the printed wiring board.

2. The conductive clip according to claim 1, wherein:

in one grip piece, a pair of the first portions is provided with a space therebetween;

the second portion is bridged between the distal ends of the pair of the first portions; and the third portion is integrally formed on an area of the base end of the second portion, the area being integrally formed on the distal end of each of the pair of the first portions.

\* \* \* \* \*